(12) United States Patent
Sugita et al.

(10) Patent No.: US 6,191,649 B1
(45) Date of Patent: Feb. 20, 2001

(54) QUADRATURE DEMODULATOR AND METHOD FOR QUADRATURE DEMODULATION

(75) Inventors: Yasushi Sugita; Masaki Nishikawa, both of Kanagawa-ken (JP)

(73) Assignee: Kabushiki Kaisha Toshiba, Kanagawa-ken (JP)

( * ) Notice: Under 35 U.S.C. 154(b), the term of this patent shall be extended for 0 days.

(21) Appl. No.: 09/346,545

(22) Filed: Jul. 2, 1999

(30) Foreign Application Priority Data

Jul. 3, 1998 (JP) .................................................. 10-188793

(51) Int. Cl.[7] .............................. H03D 3/00; H04L 27/227
(52) U.S. Cl. ........................ 329/304; 329/308; 375/327; 375/329; 375/344
(58) Field of Search .................................. 329/304–310; 375/324–333, 344, 345

(56) References Cited

U.S. PATENT DOCUMENTS

| | | | |
|---|---|---|---|
| 5,049,830 | * | 9/1991 | Yoshida ................................. 329/306 |
| 5,170,415 | * | 12/1992 | Yoshida et al. ......................... 375/80 |
| 5,335,354 | * | 8/1994 | Kioke ................................. 455/192.2 |
| 5,410,593 | * | 4/1995 | Taga et al. ............................ 375/376 |
| 5,418,815 | * | 5/1995 | Ishikawa et al. ...................... 375/216 |
| 5,440,268 | * | 8/1995 | Taga et al. ............................ 329/308 |
| 5,440,587 | * | 8/1995 | Ishikawa et al. ...................... 375/332 |
| 5,694,389 | * | 12/1997 | Seki et al. ............................. 370/208 |
| 5,905,405 | * | 5/1999 | Ishizawa ............................... 329/308 |
| 5,909,148 | * | 6/1999 | Tanaka ..................................... 331/2 |
| 6,023,491 | * | 2/2000 | Saka et al. ............................ 375/326 |

FOREIGN PATENT DOCUMENTS 09-74431    3/1997    (JP) .

* cited by examiner

Primary Examiner—David Mis
(74) Attorney, Agent, or Firm—Pillsbury Madison & Sutro LLP (57) ABSTRACT

A quadrature demodulator detects a phase angle error determined from the phase angle supplied from constellation symbols of outgoing in-phase and quadrature components of a modulated signal and and the phase angle of a NCO. The quadrature demodulator comprises a receiving circuit for receiving a quadrature modulated signal, and a local oscillator for generating a local carrier. A complex multiplier demodulates the quadrature modulated signal by complex-multiplying the quadrature modulated signal with the local carrier generated in the local oscillator. A symbol error detector detects a symbol error between the carrier of the modulated signal and the local carrier supplied from the signal demodulated at the complex-multiplier. A feedback loop controls the local carrier generated at the local oscillator by feeding back the symbol error detected at the symbol error detector to the local oscillator.

10 Claims, 7 Drawing Sheets

QUADRATURE DEMODULATOR AND METHOD FOR QUADRATURE DEMODULATION

FIELD OF THE INVENTION

The present invention relates to a digital demodulation device and method for demodulating a signal whose phase is digitally modulated.

BACKGROUND OF THE INVENTION

Figure 7:
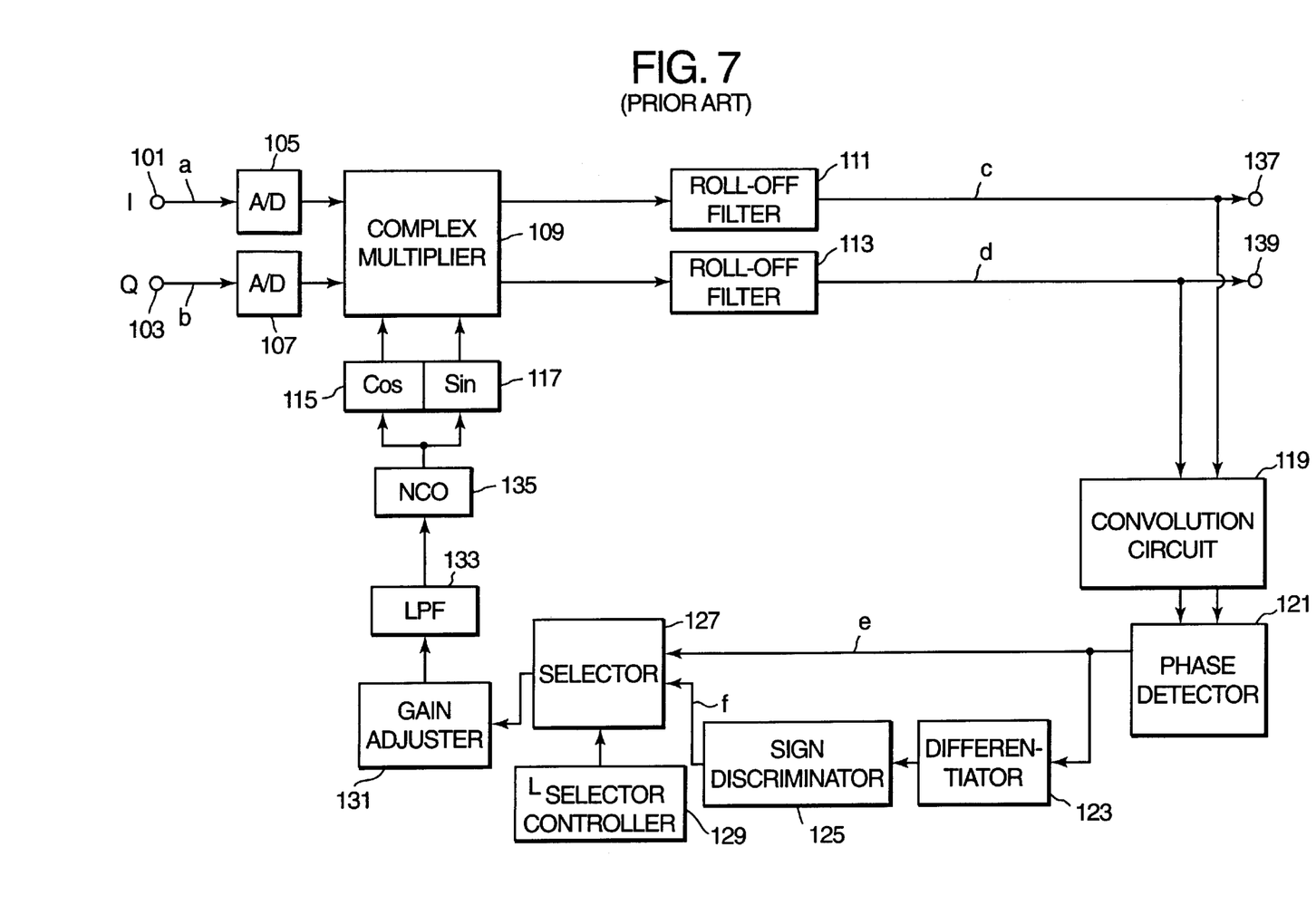
FIG. 7 is a block diagram showing a conventional quadrature demodulator.

FIG. 7 shows the construction of a conventional quadrature demodulator. Conventional quadrature demodulators have been constructed to form a feedback loop arrangement. In-phase (I) component (a), and quadrature (Q) component (b) of the digital modulated signal are input to the quadrature demodulator via input terminals 101 and 103.

These signals are inputted to A/D converters 105 and 107 and converted to digital values. The outputs of the A/Ds 105 and 107, respectively, are inputted to a complex multiplier 109. The digitized in-phase and quadrature components are demodulated at a complex multiplier 109 by using a local carrier which is introduced separately into the complex multiplier 109. Then, a frequency error and a phase error are removed from the demodulated signals by controlling the local carrier (to be described later) in accordance with feedback operation.

The calculation of the complex multiplier is input to roll-off filters 111 and 113, where they are shaped by being subjected to a filtering process. Then the shaped I and Q components (c) and (d) are output from the circuit through output terminals 137 and 139.

The calculation of the complex multiplier is also supplied to a convolution circuit 19. The values of signals (c) and (d) designate a coordinate on an I-Q orthogonal signal constellation. The designated coordinate will be referred to as a symbol. If a symbol of a subject signal matches a reference symbol, such a match means that no errors exist in the frequencies and phases of the subject signal. However, if the symbol deviates from the reference symbol, then, an error does exist. As a result of the error of a phase angle between the I-Q coordinate of the symbol and the reference symbol coordinate is detected by a detector 121.

The convolution circuit 119 is provided before the phase detector 121 for rotating the symbols a sufficient number of rotations so that the symbols are positioned in the first quadrant of the I-Q plane. The phase detector 121 detects the phase angle between the symbol and the reference symbol.

A phase angle signal (e) detected at the phase detector 121 is supplied to an error detector 123 and a selector 127. The differentiator 123 detects the error between the phases of sequential signals by calculating the difference between the input signals. Then, the differentiator 123 outputs a symbol to a sign discriminator 125, which determines whether the sign of the symbol is positive and negative.

The selector 127 selects either the phase angle signal (e) of the phase detector 121 or the sign signal (f) obtained in the sign discriminator 125. The signal selection at the selector 127 is organized by a selector controller 129. When the quadrature demodulator executes a frequency synchronizing operation the selector 127 selects the sign signal (f) from the sign discriminator 125. On the other hand, when the quadrature demodulator executes a phase synchronizing operation the selector 127 selects the phase angle signal (e) directly supplied from the phase detector 121.

The gain of the signal selected at the selector 127 is properly adjusted in a gain adjuster 131. Then, the signal is smoothed in a low pass filter (LPF) 133 to remove its high frequency. The smoothed signal of the LPF 133 is used as a control signal to control the local carrier generated at a numerically controlled oscillator (NCO) 135. The local carrier is then converted into a cosine wave component and a sine wave component at a cosine converter 115 and a sine converter 117, respectively. The cosine and the sine wave components are then multiplied with the in-phase and the quadrature components of the modulation signal at the complex multiplier 109, in order to produce baseband signals, i.e., demodulated in-phase and quadrature components.

The feedback loop of the conventional quadrature demodulator, as shown in FIG. 7, disadvantageously has a loop delay. The loop delay represents the time that it takes for the signals input to travel through the feedback loop and return back to the input terminal. In order words, the time necessary for the input signal supplied to the complex multiplier 109 to leave and return back to the complex multiplier 109 via the feedback loop.

Since the quadrature demodulator for the digital demodulated signals digitally processes the signals, latches constructed by, for example, flip-flops circuits are added in many circuit elements for synchronizing signals among the circuit's elements.

Latches are indispensable components for all circuit elements. However, as the number of latches added to a circuit increases, the more likely the loop delay will increase. Further, the feedback loop includes additional circuits, which perform less important functions in the frequency or phase locked loops, such as the roll-off filters 111 and 113. But these additional circuits also require latches. As a result, the loop delay of the feedback loop increases even further due to the increased number of latches.

If the loop delay of the feedback loop continues to increase, at some point, the circuit will begin to experience drawbacks, wherein the frequency pull-in range of the feedback loop will be reduced, and the phase jitter generated after the phase synchronization increases. By definition, the frequency pull-in range is the measure of the maximum reference frequency deviation from the nominal rate that can be overcome by a slave clock to pull itself into synchronization, and the phase jitters are short-time variations of the significant instants of a digital signal from its ideal position in time. Specifically, in the conventional circuit, the frequency pull-in range will begin to vary in accordance with the loop delay, which increases according to the number of latches. As a result, there is a need to decrease the number latches in order to improve the circuit's ability to efficiently demodulating the incoming signals.

SUMMARY OF THE INVENTION

It is, therefore, an object of this invention is to provide a quadrature demodulator and method which is able to decrease the number of latches. Thus, the invention is able to enlarge the frequency pull in range of a feedback loop and improve the circuit's ability to recover a carrier signal.

In order to achieve the above objective, a quadrature demodulator according to a first aspect of the present invention includes, a receiving circuit for receiving a quadrature modulated signal, a local oscillator for generating a local carrier, a complex multiplier for demodulating a quadrature modulation signal by complex multiplying the quadrature modulated signal with the local carrier generated in the local oscillator, a symbol error detector for detecting a symbol error between the carrier of the modulated signal and the local carrier from the signal demodulated at the complex-multiplier, a feedback loop for controlling the local carrier generated at the local oscillator by feeding back the symbol error detected at the symbol error detector to the local oscillator, a compensation signal generator for generating a compensation signal under the control of the symbol error branched from the feedback loop, and a compensator for compensating the local carrier to reduce the symbol error according to the compensation signal.

A quadrature demodulator according to a second aspect of the present invention includes, a first A/D converter for digitizing in-phase components of a quadrature modulation signal, a second A/D converter for digitizing quadrature components of the quadrature modulation'signal, a complex multiplier for complex multiplying the outputs from the first and the second A/D converters with a cosine wave component and a sine wave component to produce demodulated in-phase and quadrature components, a phase detector for detecting a phase angle of a residual carrier in the demodulated signal from both constellation symbols of the demodulated in-phase and quadrature components, an error detector for detecting the error components from the phase angle of the output of the phase detector, a low pass filter for smoothing the error output from the error detector, a first numerical control oscillator for generating a local main-carrier in accordance with the error signal output of the low pass filter, a cosine converter for converting the local main-carrier output from the first numerical control oscillator into a cosine wave component, a sine converter for converting the local main-carrier output from the first numerical control oscillator into a sine wave component, a second numerical control oscillator for generating a local sub-carrier in accordance with the output of the low pass filter, a first gate for allowing or blocking the transmission of the output of the low pass filter to the first numerical control oscillator, and a second gate for allowing or blocking the transmission of the output of the low pass filter to the error detector via the second numerical control oscillator.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the additional advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to FIGS. 1 through 6.

In the following explanation, QPSK (quadrature phase shift keying) signals are discussed as an exemplary signal to be demodulated according to the invention. However, signals intended in the present invention are not limited to QPSK signals.

Figure 1:
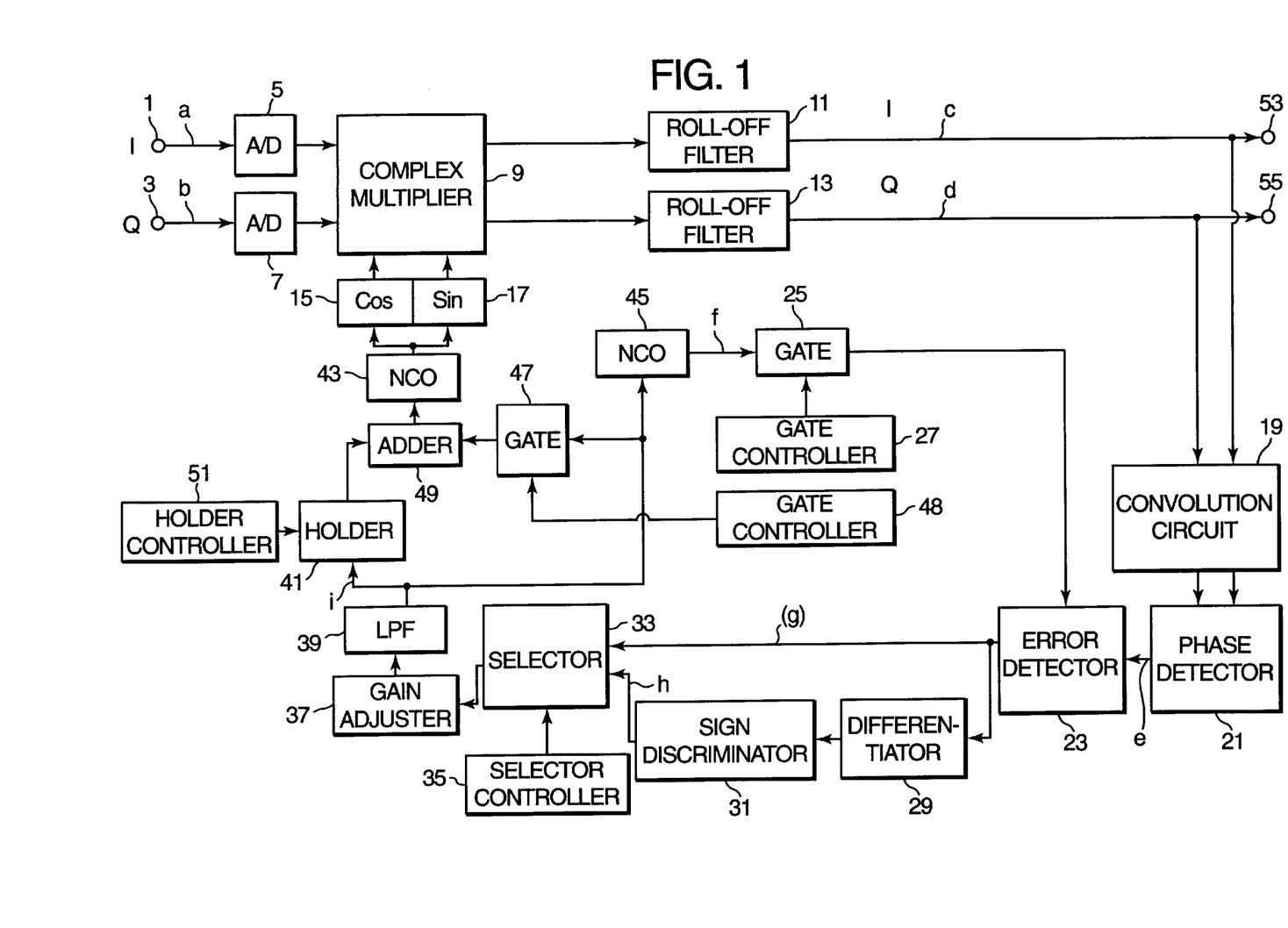
FIG. 1 is a block diagram showing an embodiment of the quadrature demodulator according to the present invention.

FIG. 1 shows an embodiment of a quadrature demodulator according to the present invention. An in-phase component (a) and a quadrature component (b) of the modulated signal are supplied to a complex multiplier 9 through input terminals 1 and 3. Then, these signals are inputted to A/D converters 5 and 7 and converted to digital values.

The complex multiplier 9 demodulates the baseband signals of the digitized in-phase and quadrature components (a) and (b) by complex multiplying them with sine-wave and cosine-wave components of a local carrier supplied from a cosine converter 15 and a sine converter 17 (to be described later). The baseband signals, which are demodulated at the complex multiplier 9, are supplied to the roll-off filters 11 and 13 where they are equalized. Then, the basebasnd I and Q components are output through output terminals 53 and 55. The baseband I and Q components (c) and (d) are also supplied to a convolution circuit 19.

The convolution circuit 19 rotates a signal constellation symbol representative of the baseband I and Q components (c) and (d) for a sufficient number of rotations so that the symbols are positioned in the first quadrant on an I-Q signal constellation plane. The above operation is executed as a pre-processing step prior to detecting a phase angle of a residual carrier in the demodulated signal at a phase detector 21.

That is, the phase detector 21 detects the carrier phase angle based on the constellation symbol of the signals (c) and (d) obtained at the convolution circuit 19.

An error detector 23 detects the error between the phase angle signal (e) obtained at the phase detector 21 and signal (f) which will be described later. The error signal (g) detected at the error detector 28 is supplied to a differentiator 29 and a selector 33.

The differentiator 29 calculates the phase error between the two symbols which are continuous in time with each other. A sign discriminator 31 discriminates the sign of the phase error signal obtained at the differentiator 29. That is, the sign discriminator 31 determines whether the difference is positive (+), negative (−) or zero. The sign signal (h) obtained at the sign discriminator 31 is used as a rough, but fast, locking pull-in operation at the initial stage of the operation.

The selector 33, which operates under the control of a selector controller 35, selects either signal (g) or sign signal (h). A gain adjuster 37 properly adjusts the gain of either signal (g) or (h) selected at the selector 33.

The gain signal is smoothed through an LPF 39 where its high frequency components are suppressed. The smooth signal (i) is divided into two outputs and transmitted to a holder 41 and an NCO 45.

The NCO 45 generates a local sub-carrier which has a phase angle responsive to the amplitude of the signal (i) at the LPF 39. A gate 25 allows or blocks the transmission of the local sub-carrier generated at the NCO 45 to the error detector 23. Gate 25 operates under the control of a control signal sent from a gate controller 27 such that gate 25 opens or closes in order to permit or block, respectively, the transmission of the local sub-carrier signal to the error detector 23.

When the transmission of the local sub-carrier, especially the phase angle signal (f) is blocked at the gate 25, only the phase angle signal (e) from the phase detector 21 is transferred through the error detector 23.

Returning to holder 41, the holder 41 generally outputs the output signal (i) of the LPF 39. However, holder 41 may operate under the control of controller 51 where it is instructed to hold the output signal (i) of the LPF 39 and output the signal that was previously held therein.

An adder 49 adds the sum of the signal held in the holder 41 and the signal (i) currently supplied from the LPF 39 through a gate 47. The gate 47, under the control of a gate controller 48, allows or blocks the transmission of the signal (i) obtained at the LPF 39 to the adder 49.

That is, when the gate 47 is positioned in a closed state, the adder 49 provides only the signal (i) held in the holder 41 to the NCO 43. The NCO 43 then generates the local main-carrier in accordance with the signal supplied from the adder 49.

The local main-carrier generated at the NCO 43 is converted into the cosine and the sine-wave components at the cosine converter 15 and sine converter 17, respectively. Next, the cosine and the sine-wave components are supplied to the complex multiplier 9 where they are then utilized for demodulating the baseband signals, as previously described. At the complex multiplier 9 the cosine and sine-wave components are complex-multiplied with the in-phase and quadrature components of the modulated signal.

In this embodiment, the gate controller 27, the holder controller 48 and the hold controller 51 may be constructed in a timer configuration wherein each respective control signal is transmitted after a predetermined time from the start of the demodulating operation.

Figure 2:
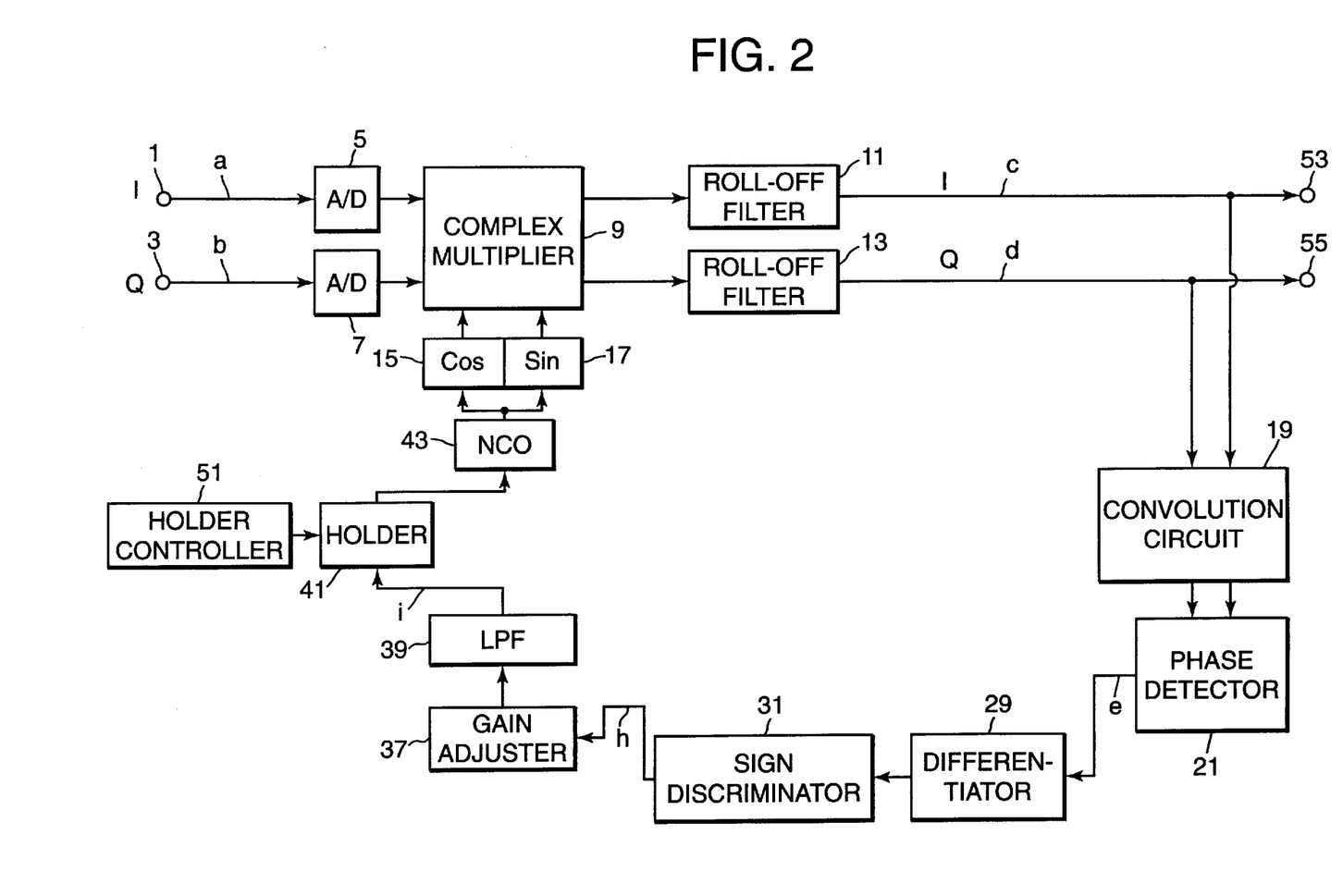
FIG. 2 is a block diagram showing the construction of one embodiment of the quadrature demodulator according to the present invention.
Figure 3:
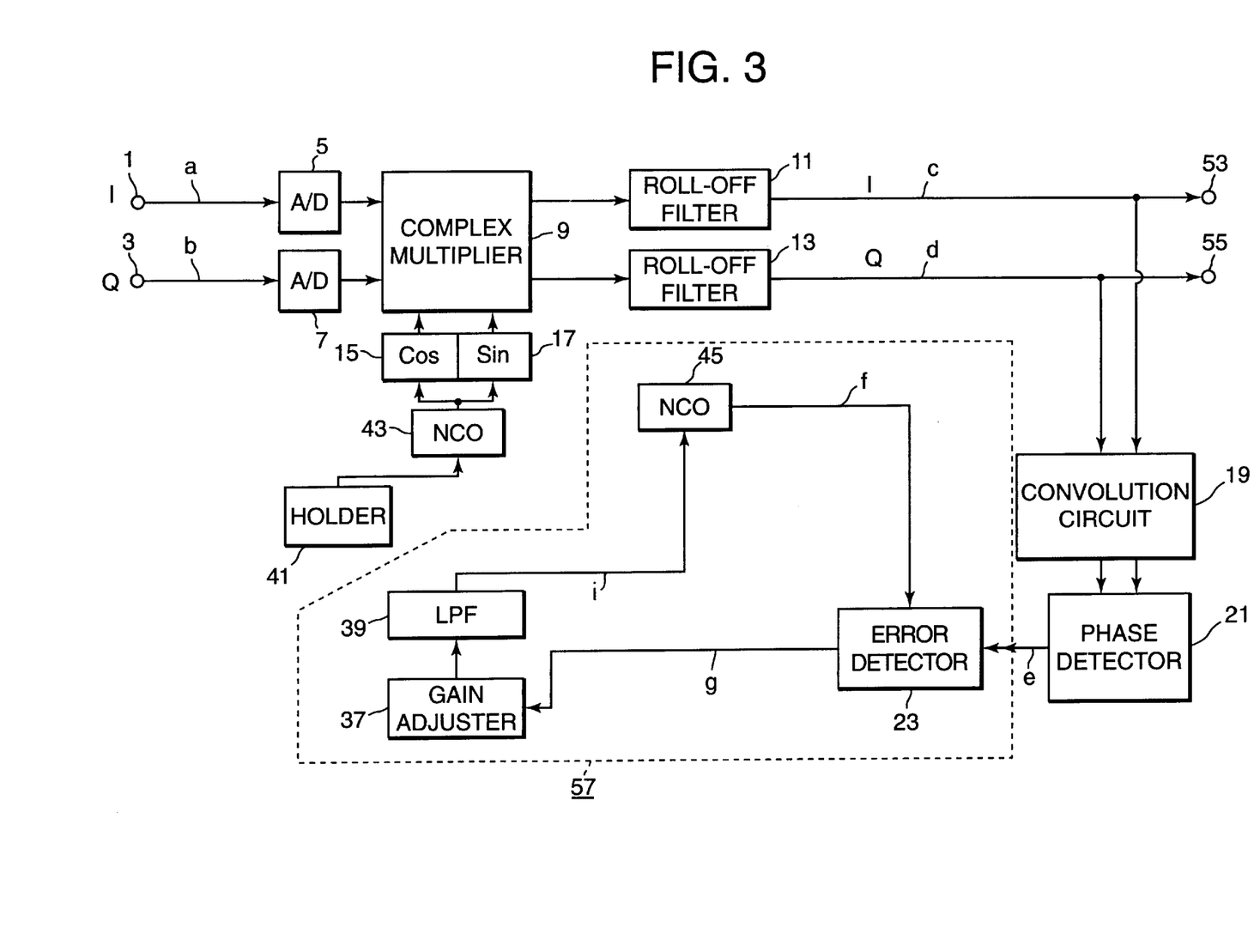
FIG. 3 is a block diagram showing the construction of one embodiment of the quadrature demodulator according to the present invention.
Figure 4:
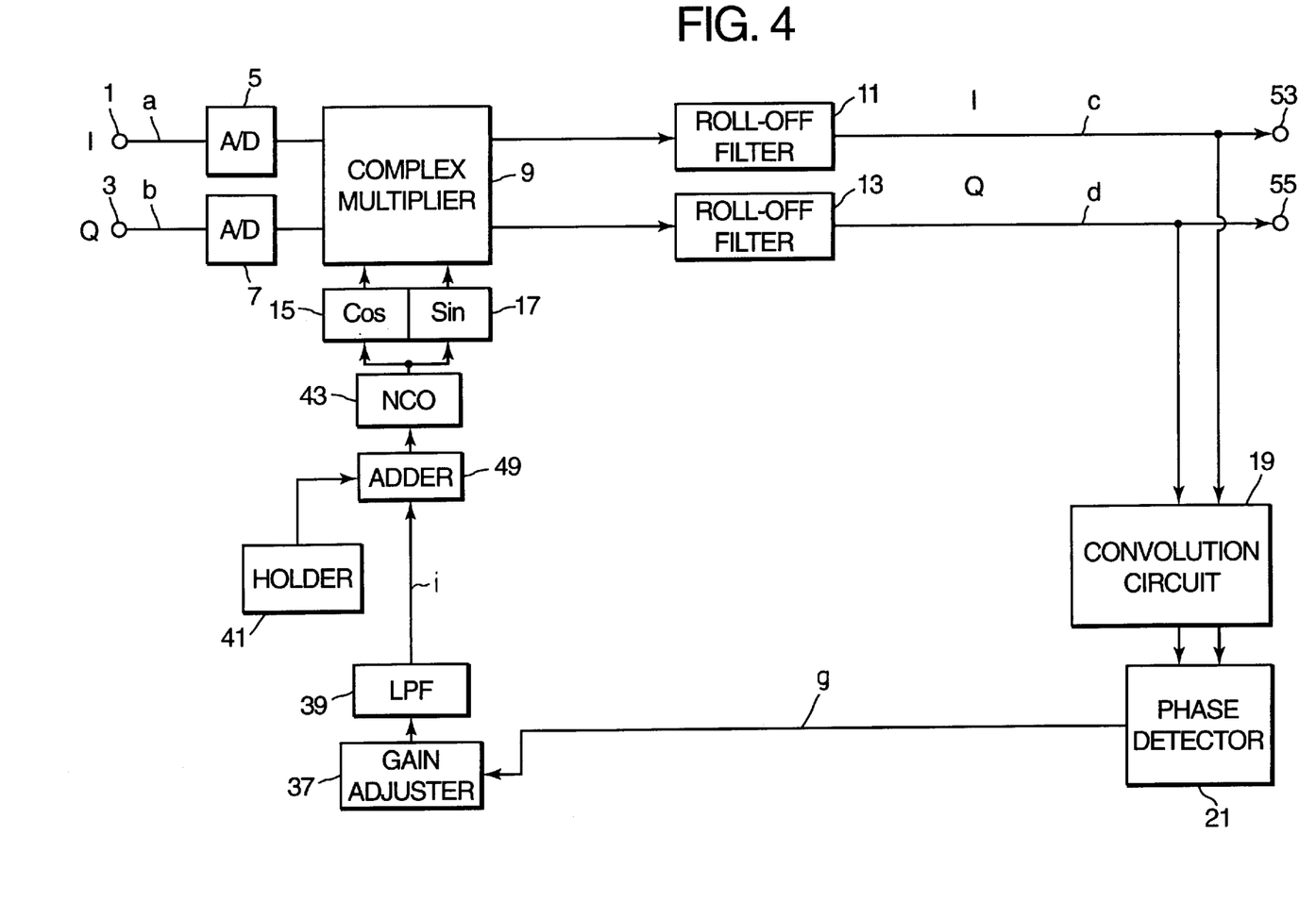
FIG. 4 is a block diagram showing the construction of one embodiment of the quadrature demodulator according to the present invention.

Referring now to FIGS. 2, 3, and 4, the structure and operation of the circuit shown in FIG. 1 will be explained. The circuit elements that perform the same functions are assigned the same reference numeral in each drawing.

FIG. 1 operates as the circuit shown in FIG. 2, when the selector controller 35 initially controls the selector 33 to select the input of signal (h), instead of signal (g). Then, the gate controller 48 sends a control signal that instructs the gate 47 to close, which blocks the transmission of signal (i) from entering adder 49. Likewise, gate controller 27 transmits a control signal that instructs gate 25 to close, which blocks the transmission of signal (f) to the error detection 23.

Meanwhile, the holder controller 51 instructs the holder 41 to provide signal (i) directly therethrough to NCO 43. At this point, the function of the circuit, as shown in FIG. 1, becomes equivalent to the configuration shown in FIG. 2.

In the configuration, as shown in FIG. 2, the in-phase component (a) and the quadrature component (b) of the modulated signal are digitized in the A/D converters 5 and 7. The complex multiplier 9 demodulates the baseband signals by complex-multiplying the in-phase component (a) and the quadrature component (b) with the cosine and sine wave components of the local main-carrier supplied from the cosine converter 15 and the sine converter 17.

Here, the signal supplied to the NCO 43 originates from the phase error signal (h) determined between two signals which are continuous in time with each other and calculated at the differentiator 29.

Since the determination at the differentiator 29 of the phase error between the two symbols which are continuous in time with each other at the differentiator 29 is equivalent to determining the frequency of the modulated signal, the configuration, as shown as FIG. 2, operates as a frequency locking loop. The frequency locking operation makes the loop into a stable frequency-locked state when the NCO 43 oscillates at the same frequency of the carrier of the modulated signal. In this stable frequency-locked state, the holder 41 holds the signal (i) from the LPF 39 under the control of the holder controller 51.

Since the frequency locked state in the configuration, as shown in FIG. 2, is vulnerable to deterioration by disturbances or interferences, it is difficult to main the stability and accuracy of the frequency locking operation of the configuration, as shown in FIG. 2.

As a result, the circuit modifies its configuration to operate as the circuit shown in FIG. 3, the selector controller 35 controls the selector 33 to select the signal (g), and the gate controller 27 controls gate 25 to allow the transmissions of the phase angle signal (f) from the NCO 47 to the error detector 23. Gate controller 48 then transmits a control signal that instructs gate 45 to close, which blocks the transmission of signal (i) to adder 49.

At this point, the holder 41 continues to provide the signal (i) of the LPF 39 which was previously held therein to the NCO 43 under the control of holder controller 51, as previously discussed and as shown in FIG. 2. Accordingly, the function of the circuit, as shown in FIG. 1, becomes equivalent to the configuration, as shown in FIG. 3.

In the configuration, as shown in FIG. 3, the in-phase component (a) and the quadrature component (b) of the modulated signal are also digitized in the A/D converters 5 and 7. The complex multiplier 9 demodulates the baseband signals by complex-multiplying the in-phase component (a) and the quadrature component (b) with the cosine and sine wave components of the local main-carrier supplied from the cosine converter 15 and the sine converter 17.

At this stage, in FIG. 3, the NCO 43 is provided with the signal previously held in the holder 41. Thus, the complex multiplier 9 can only reduce a certain amount of frequency detuning of the local main-carrier supplied from the carrier of the modulated signal. The baseband signals demodulated at the complex multiplier 9 are equalized at roll-off filters 11 and 13. Then, the baseband signals are transmitted to the convolution circuit 19 where they are rotated for a sufficient number of rotations so that the symbol falls within the first quadrant on the I-Q signal constellation plane. Then in the phase detector 21, the phase (e) of the symbol is detected.

An error between the phase angle signal (e) from the phase detector 21 and signal (f) from the NCO 45 is detected at the error detector 23. The level of the error signal is adjusted in the gain adjuster. Then, the error signal (g) is smoothed through the LPF 39. Then smoothed signal (i) is transmitted to the NCO 45 where it is used for determining the phase of the local sub-carrier generated in the NCO 45.

In FIG. 3, if the phase angle (f) of the local sub-carrier generated at the NCO 45 corresponds to the phase angle of the signal (e) provided from the phase detector 21, the output of the error detector 23 becomes zero. Then, the circuit of the feedback loop 57 will consist of the error detector 23, the gain adjuster 37, the LPF 39 and the NCO 45, which becomes a phase-locked loop. When the feedback loop is in a phase-locked state, the frequency of the local sub-carrier of the NCO 45, which is determined by signal (i) provided from the LPF 39, completely coincides with the frequency of the carrier of the modulated signal. The NCO generates a local sub-carrier having a phase angle which responds to the signal delay occurring in the circuit elements such as the complex multiplier 9, the roll-off filters 11 and 13, etc. However, the phase of the local sub-carrier generated at the NCO 45 deviates from that of the carrier of the modulated signal by an amount corresponding to a delay caused by the circuit elements such as the complex multiplier 9, the roll-off filters 11 and 13 etc. In other words, the NCO detects the amount of the signal delay caused by such circuit elements and generates a corresponding phase angle data or information. The phase angle data or information is then supplied or fed-back to the complex multiplier 9. The complex multiplier 9 then operates to compensate the signal delay occurring in the circuit elements.

The circuit configuration, shown in FIG. 3, can be simplified to contain less elements by feeding back the local sub-carrier generated at the NCO 45, i.e., the phase signal (f), which is used for eliminating the frequency detuning and/or the phase detuning between the carrier signal and the signal detected at the error detector 23.

In essence, the number of latches (not shown) in the quadrature demodulator can be greatly decreased. Therefore, the frequency pull-in range of the feedback circuit 57 can also be greatly expanded in comparison to the frequency pull-in range of the conventional circuit.

Furthermore, since the feedback circuit 57 uses the phase angle signal (e) as its input to detect the phase error in the error detector 23, the feedback circuit 57 functions as a phase-locked loop, as previously discussed. The phase-lock operation is highly resistant to disturbances and possesses a wide phase-locking range. Thus, the phase-lock operation is capable of providing a very accurate phase-locking operation.

That is, the configuration, as shown in FIG. 3, can utilize the phase locking operation of the feedback circuit 57 to reduce the frequency detuning remaining in the carrier signal after the operation illustrated in the configuration of FIG. 2 is performed.

As a result, as shown in FIG. 3, the signal (i) provided from the LPF 39 has sufficient amplitude for controlling the NCO 45 to generate the local sub-carrier which is capable of eliminating the frequency detuning from the carrier of the modulated signal. However, in this configuration, since the signal (i) is not fed back to the complex multiplier 9, but directed to the NCO 45, the output signals (c) and (d) of the demodulating signal still are deteriorated by the frequency and phase detuning of the carrier signals.

After the operation of the configuration as shown in FIG. 3 is performed, the circuit may adjust its configuration to implement the circuit illustrated in FIG. 4. Under the control of the selector controller 35, the selector 33 selects the signal (g), and, under the control of the gate controller 27, the gate 25 blocks the transmission of the phase angle signal (f) to the error detector 23. At this point, the gate 47 allows the transmission of the signal (i) from the LPF 39 to the adder 49 under the control of the gate controller 48. At the completion of implementing the circuit of FIG. 4, the holder 41 reverts back to carrying out its operations according to FIG. 1. Under the control of the holder controller, according to FIG. 1, the holder receives a control signal to hold the signal (i) which is supplied to holder 41 at the end of the operation of FIG. 4.

According to the above operations of gates 25, 47 and the selector 33, the configuration, as shown in FIG. 1, becomes equivalent to the configuration, as shown in FIG. 4.

In the configuration, as shown in FIG. 4, the in-phase component (a) and the quadrature component (b) of the modulated signal are also digitized in the A/D converters 5 and 7. The complex multiplier 9 demodulates the baseband signals by complex-multiplying the in-phase component (a) and the quadrature component (b) with the cosine and sine wave components of the local main-carrier supplied from the cosine converter 15 and the sine converter 17.

The baseband signals demodulated at the complex multiplier 9 are equalized at roll-off filters 11 and 13. Then, the output is divided into two outputs. One output is outputted through the output terminal 53 and 55.

The other output is transmitted to the convolution circuit 19, which rotates a constellation symbol supplied by the baseband I and Q components (c) and (d) a sufficient number of rotations so that the symbol falls within the first quadrant of an I-Q constellations plane.

The phase detector 21 detects the carrier phase angle based on the constellation symbol of the signals (c) and (d) determined at the convolution circuit 19. A gain adjuster 37 properly adjusts the gain of the signal (g) or (h) selected at the selector 33.

The LPF 39 smoothes the gain adjusted signal. The adder 49 adds the signal held in the holder 41 and the signal (i) currently supplied from the LPF 39 through the gate 47, which is controlled by gate controller 48. So that, the frequency of the local main-carrier signal generated at the NCO 43 becomes a frequency which is the sum of the frequency of the local main-carrier generated at the NCO 43 at the end of the operation of the configuration, as shown in FIG. 2, and the frequency of the local sub-carrier generated at the NCO 45 at the end of the operation of the configuration, as shown in FIG. 3.

The phase angle of the local main-carrier generated at the NCO 43 is converted into the cosine and the sine-wave components, respectively, at the cosine converter 15 and sine converter 17. The cosine and the sine-wave components are then utilized for demodulating the baseband signals by being complex-multiplied with the in-phase and quadrature components of the modulated signal, as previously described.

Since the signal supplied to the NCO 43 originates from the phase signal (e) provided from the phase detector 21 of the circuit, as shown in FIG. 4, which functions as a PLL (phase-locked loop).

In this PLL, since the phase-locking operation is terminated at the end of the operation of the circuit shown in FIG. 3, the circuit in FIG. 4 is not required to perform the frequency pull-in operation. Consequently, the loop gain of the PLL can be made smaller in comparison to the conventional circuit. In contrast to the conventional quadrature demodulator shown in FIG. 7, the feedback loop of the configuration, as shown in FIG. 4, is capable of decreasing the phase jitter since the effect of the loop gain has a smaller impact on the circuit.

Figure 5:
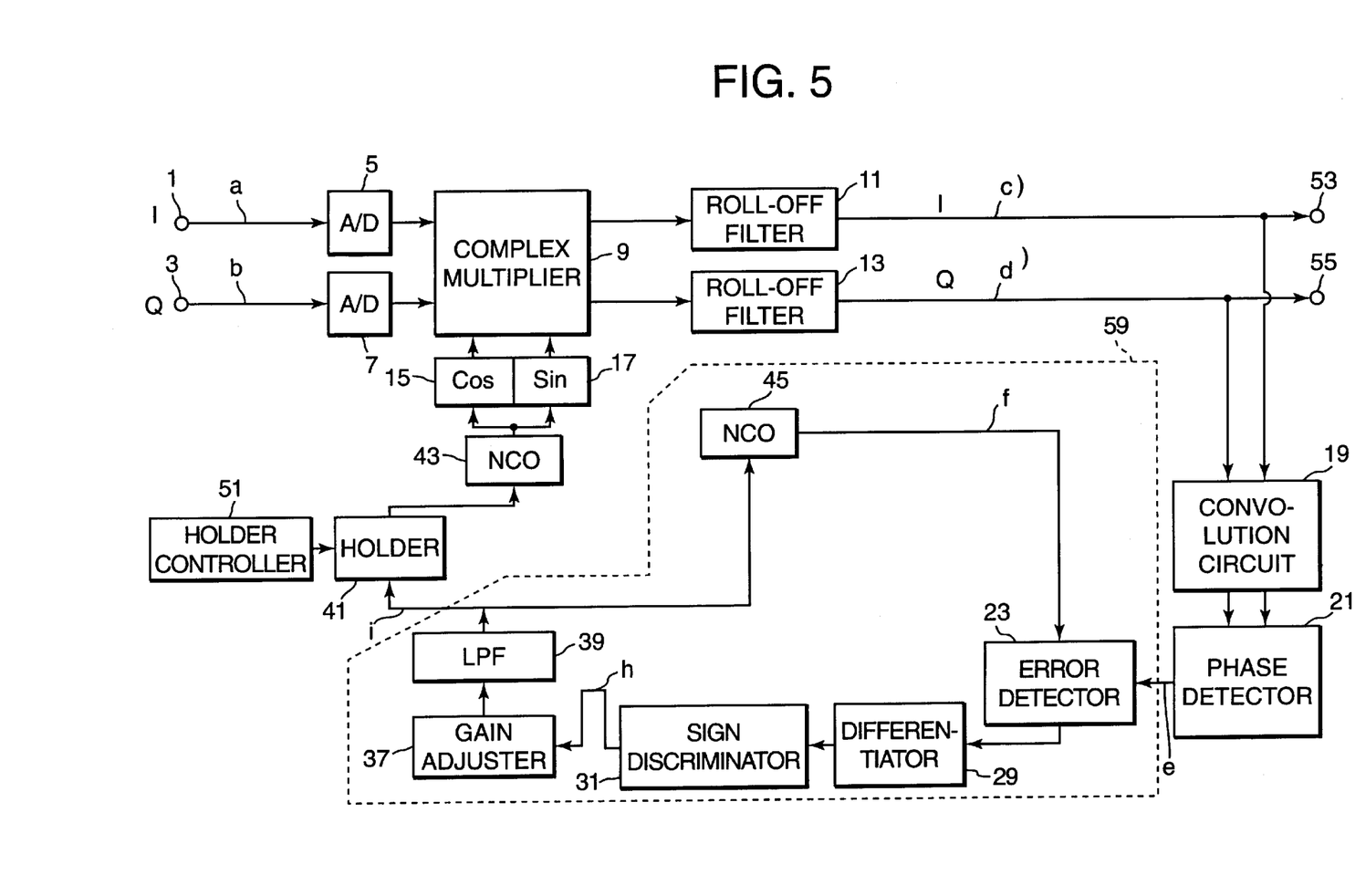
FIG. 5 is a block diagram showing the construction of one embodiment of the quadrature demodulator according to the present invention.

FIG. 5 shows a modification of the circuit shown in FIG. 1. In FIG. 5, the selector 33 selects the sign signal (h) under the control of the selector controller 35, while the gate 25 allows the transmission of the phase angle signal (f) from the NCO 45 to the error detector 23 under the control of the gate controller 27. Then, the gate 47 blocks the transmission of the signal (i) from the LPF 39 to the adder 49 under the control of the gate controller 48 so as to supply a predetermined value supplied only to the NCO 43 through the adder 49. The predetermined value may also be set, for example, to zero.

If the predetermined value is set to zero, the frequency of the local main-carrier generated at the NCO 43 also becomes zero. Moreover, when the frequency of the local main-carrier generated at the NCO 43 corresponds to a specific frequency established by a predetermined character of the in-phase component (a) and the quadrature-phase component (b) of the modulated signal, the value to be held in the holder 41 may also be changed in accordance with the predetermined character.

In FIG. 5, the in-phase component (a) and the quadrature-phase component (b) are digitized at the A/D converters 5 and 7. Then, they are complex-multiplied with sine-wave and cosine-wave components of a local carrier supplied from a cosine converter 15 and a sine converter 17 at the complex multiplier 9.

The signals demodulated at the complex multiplier 9 are equalized at the roll-off filters 11 and 13, and then the signals are output as a baseband I component (c) and a baseband Q component (d) through output terminals 53 and 55. The baseband I and Q components (c) and (d) are also supplied to a convolution circuit 19.

Since the holder 41, under the control of the holder controller 51, provides a fixed value at the start of operation of the circuit to the NCO 43 to generate the local main-carrier with a fixed frequency. Thus, initially, the cosine converter 15 and the sine converter 17 provide signals with a fixed period to the complex multiplier 9.

The signals (c) and (d) are then converted into the phase angle signal (e) through the convolution circuit 19 and the phase detector 21. Then, the error detector 23 detects an error between the phase angle signal (e) and the signal (f).

The differentiator 29 differentiates the error between two symbols that are continuous in time with each other, in relation to the phase error of the symbol output from the error detector 23.

The sign discriminator 31 discriminates the sign of the phase error signal obtained at the differentiator 29. That is, the sign discriminator 31 discriminates whether the difference determined of the phase error signal is positive (+), negative (−) or zero. The gain adjuster 37 properly adjusts the gain of the signal (h). Then, the LPF 39 smoothes the gain-adjusted signal (h) before providing the signal to the NCO 45. The NCO 45 generates a local sub-carrier which has a phase angle responsive to the amplitude of the signal (i) at the LPF 39.

In FIG. 5, loop 59 functions as a frequency-locked loop which detects the phase error from the constellation symbols of the in-phase component (c) and the quadrature-phase component (d) detected in the error detector 23. Loop 59 also detects and monitors the frequency error supplied from the phase error in the differentiator 29, so as to eliminate the frequency error.

When the frequency error, which is the output of the differentiator 29, is completely eliminated, the frequency-locked loop 59 becomes stable. At this stage of operation, the LPF 39 controls the NCO 45 to oscillate in response to the amount of the frequency detuning after the complex multiplier 9 has demodulated the modulated in-phase component (a) and the modulated quadrature-phase component (b).

Initially at the start of the operation of the configuration shown in FIG. 5, the holder 41 holds a zero value. Then, the holder 41 is updated to hold the output level of the LPF 39 under the control of the holder controller 51 when the frequency error is eliminated.

Figure 6:
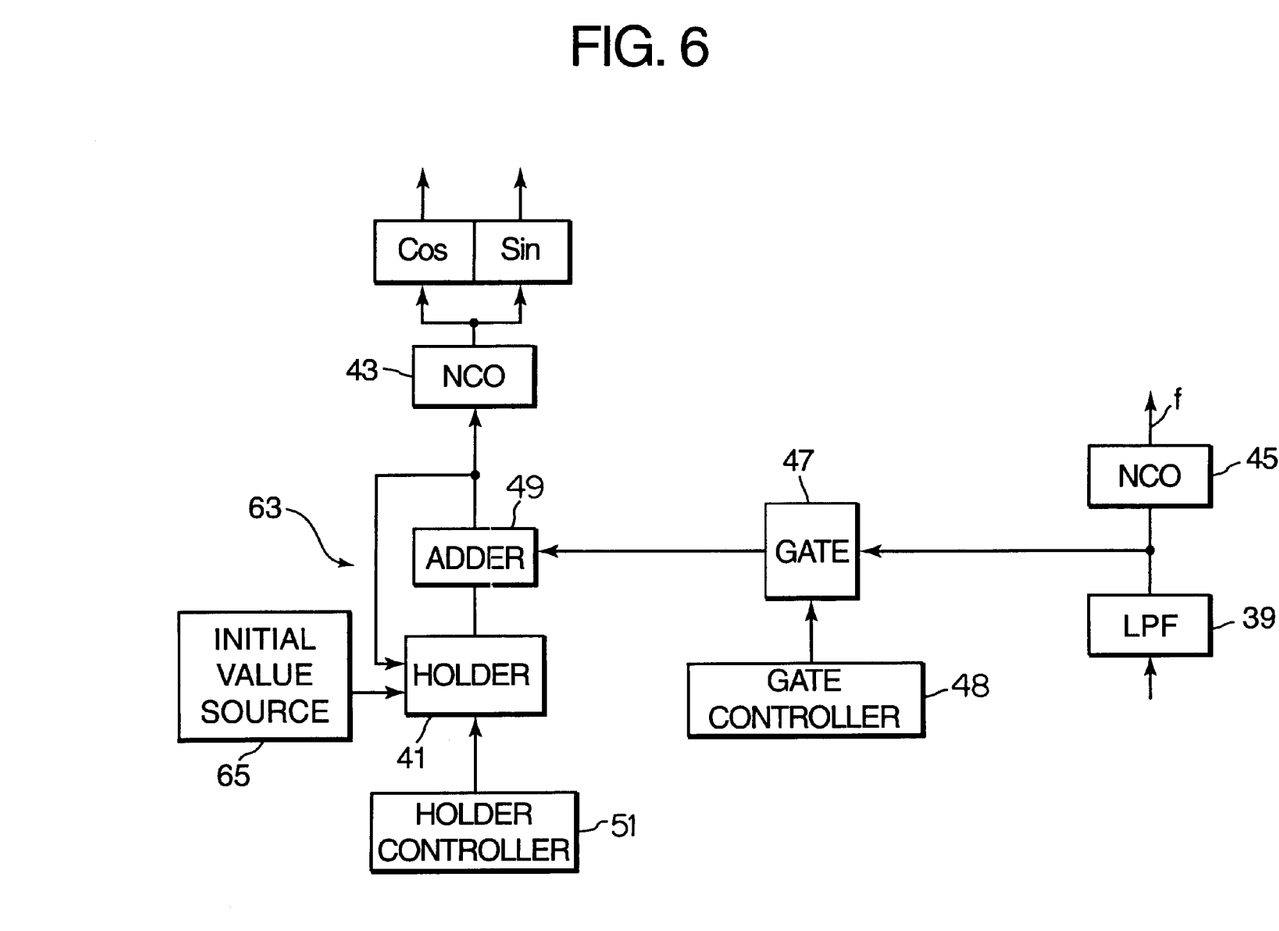
FIG. 6 is a block diagram showing modification of the section between the gain adjuster 37 and the cosine and sine converters 15, 17 in FIG. 1.

When it is necessary, the holder 41 can be instructed to hold another value besides zero at the initiation of the operation of the circuit shown in FIG. 5. However, a circuit having an additional path 63, as shown in FIG. 6, must be used for providing a predetermined initial value 65 supplied from the initial value source to the NCO 43. The additional path 63 also provides a sum calculated at adder 61 of the signal (i) transmitted from the LPF 39 and the value held in the holder 41.

FIG. 6 shows a modification of the segment of the circuit positioned between the gain adjuster 37 and the cosine and sine converters 15, 17 in FIG. 1. As shown in FIG. 6, the sum determined at the adder 49 is supplied to the holder 41 through the additional path 63. The gate 47 allows or blocks the transmission of signal (i) supplied from the LPF 39 to the adder 49 under the control of the gate controller 48.

The holder 41 holds the value supplied thereto through the additional path 63 and provides the value to the adder 49 under the control of the holder controller 51. The gate controller 48 controls the gate 47 to block the transmission of the local sub-carrier, which is the phase angle signal (f) generated at the NCO 45 and supplied to the adder 49 when the error detector 23 detects an error between the signal (e) transmitted from the phase detector 21 and the signal (f) transmitted from the NCO 45. The holder controller 51 controls the holder 41 in order to continue providing the value held therein.

When the signal detected at the error detector 23 equals the signal (e), the gate controller 48 controls the gate 47 to allow the transmission of the signal (i) transmitted from the LPF 39 to the adder 49. Immediately thereafter, the adder 49 provides the sum of the signals supplied from the gate 47 and the holder 41 to the NCO 43. Then, the holder controller 51 instructs the holder 41 to hold the sum supplied through the additional path 63. Furthermore, the holder controller 51 can instruct the holder 41 to hold a value supplied from an initial value source 65 which stores a fixed value that may be set by a designer at the start of operation of the circuit., as shown in FIG. 6.

As described above, by providing the sum obtained in the adder 49 or the preset value set in the initial value source 65 to the holder 41 and by controlling the timing to hold a value in the holder 41 under the control of the holder controller 51, the circuit is able to change the operations of the NCOs 43 and 45 numerous times, by adding simultaneously at a predetermined time the signal (i) from the LPF 39 and the value held in the holder 41.

The circuit, as shown in FIG. 5, functions as the frequency locked loop, as described above. Then, it is also possible, for example, to operate the demodulating circuit, as shown in FIG. 1, by executing the phase-locking operation in accordance with the configurations illustrated in FIGS. 3 and 4 after the completion of the operation shown in FIG. 5.

The NCO 45, shown in FIG. 1, is used for expanding the frequency pull-in range in the operations of the configurations shown in FIGS. 3 and 5. In the frequency-locking operation since the NCOs for generating local carriers are not required to perform a phase jitter suppressing function, it is commonly known that that the frequency-locking operation is not required to be as accurate as the phase-locking operation.

Therefore, the bits number to be processed in the NCO 45 may be less than that of the NCO 43. Further, when the bits number to be processed are different between the NCOS 3 and 45, the bit accuracy of the LPF 39 or the gain adjuster 37 may be changed in response to an output of the gate controller 27 or 48.

Furthermore, according to the design of the convolution circuit 19 and the phase detector 21, it is assumed to be the case that the value of the phase angle signal (e) does not exist in one quadrant between $-\pi$ to $+\pi$.

In this case, the range of the phases expressing the oscillation frequency of the NCO 45 is limited to the quadrant between zero to $2\pi$ so that the phases falls within the quadrant between $\pi/2$ to $2\pi$ when they are convoluted a sufficient number of times by units of 90 degree, so that they fall within the same quadrant from zero to $2\pi$, repeatedly. As a result, in this case, still two bits can be reduced from the bits number required to be processed in the NCO 45.

In this exemplary description, the quadrant from zero to $\pi/2$ has been taken in account because of the signal constellation of the QPSK modulation. While in a case of the PSK (phase shift keying) signal, other areas such as a quadrant from zero to $\pi/4$ specific to the format of the signal to be demodulated may be employed.

As mentioned above, the quadrature demodulator according to the present invention is characterized in that the frequency or phase error is not determined from the complex multiplication of the cosine or sine converted local carrier phase with the modulated signal such as the conventional one, but has a circuit for detecting the error directly from the phase angle signal (e) which is supplied from the constellation symbols (c) and (d) of the outgoing I signal and the outgoing Q signal, respectively, and the phase angle (f) from the NCO 45.

By directly comparing the phase angle signal (e) from the phase detector and the phase angle (f) from the NCO 45, the circuit is able to decrease the overhead in the control loop, so that the phase-locked loop can be obtain for a very wide frequency pull-in range which is logically close to its limit.

Further, by using an adder such as the adder 49, a holder such as the holder 41, a gate such as the gate 47 and a gate controller such as the gate controller 48, a value established after the frequency pull-in operation is supplied to an NCO such as the NCO 43, which applies a local carrier phase angle to the complex multiplier for eliminating a frequency and/or phase detuning between the carrier of the modulated signal and the local carrier, so that the circuit is able to accurately demodulate the quadrature modulation signal.

According to the quadrature demodulator of the present invention, by using the circuit which directly detects the error between the phase angle signal (e) from the phase detector and the phase angle (h) from the NCO 45, the circuit can expand the frequency pull-in range of the phase and frequency locking operations, and further improve the accuracy of the local carrier frequency obtained after the frequency pull-in operation. In the demodulating circuit, the frequency pull-in range and the accuracy of the circuit are directly related so that the present invention is able to improve the performance of the quadrature demodulator.

As described above, the present invention can provide an extremely preferable quadrature demodulator and method for quadrature demodulation.

That is, in accordance with the present invention, the frequency pull-in range is expanded by decreasing the number of latches which decreases the loop delay, and thus improves the carrier recovering ability.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a divisional application.

What is claimed:

1. A quadrature demodulator, comprising:
    a receiving circuit for receiving a quadrature modulated signal;
    a local oscillator for generating a local carrier;
    a complex multiplier for demodulating a quadrature modulated signal by complex-multiplying the quadrature modulated signal with the local carrier generated in the local oscillator;
    a symbol error detector for detecting a symbol error between the carrier of the modulated signal and the local carrier determined from the signal demodulated at the complex-multiplier;
    a feedback loop for controlling the local carrier generated at the local oscillator by feeding back the symbol error detected at the symbol error detector to the local oscillator;
    a numerical control oscillator for generating a recovered phase signal under the control of the symbol error branched from the feedback loop; and
    an error detector for compensating the local carrier to reduce the symbol error according to the recovered phase signal.

2. A quadrature demodulator, comprising:
    a first A/D converter for digitizing in-phase components of a quadrature modulation signal;
    a second A/D converter for digitizing quadrature components of the quadrature modulation signal;
    a complex multiplier for complex multiplying the outputs from the first and the second A/D converters with a cosine wave component and a sine wave component to produce demodulated in-phase and quadrature components;
    a phase detector for detecting a phase angle of a residual carrier in the demodulated signal based on the constellation symbols of the demodulated in-phase and quadrature components;
    an error detector for detecting the error components of the phase angle of the output of the phase detector;
    a low pass filter for smoothing the error output received from the error detector;
    a first numerical control oscillator for generating a local main-carrier in accordance with the error signal output of the low pass filter;
    a cosine converter for converting the local main-carrier output from the first numerical control oscillator into a cosine wave component;

a sine converter for converting the local main-carrier output from the first numerical control oscillator into a sine wave component;

a second numerical control oscillator for generating a local sub-carrier in accordance with the output of the low pass filter;

a first gate for allowing or blocking the transmission of the output signal supplied from the low pass filter to the first numerical control oscillator; and a second gate for allowing or blocking the transmission of the output signal supplied from the low pass filter to the error detector to the second numerical control oscillator.

3. A quadrature demodulator according to claim 2 wherein the error detector determines the error between the output phase angles of the phase detector and the second numerical control oscillator.

4. A quadrature demodulator claimed in one of the claim 2 or claim 3 further comprising;

a holder for setting the oscillation frequency by supplying the input of the first numerical control oscillator when the second gate inputs the phase angle of the output of the second numerical control oscillator into the error detector so that output of the error from the phase angle of the phase detector, and when the second gate closes and does not input the output of the second numerical control oscillator into the error detector so that the phase angle from the phase detector is the output of the error detector supplied as the input transmitted the first numerical control oscillator through the LPF so that the oscillation frequency changes according to the output of the low pass filter;

an adder for adding the oscillation frequency of the second numerical control oscillator to the frequency of the first numerical control oscillator, when the output of the low pass filter is applied to the first numerical control oscillator by way of the first gate after the detection of the error between the phase angle supplied from the phase detector and the phase angle of the output of the second numerical control oscillator by way of the second gate.

5. A quadrature demodulator according to claim 4;

wherein the error detector determines the error between the phase angle of the output from the phase detector and the phase angle of the output of the second numerical control oscillator;

a differentiator for determining the error between the phase angle outputted from the error detector and the phase angle of the subsequent signal; and a sign discriminator for discriminating whether the output of the error detector is a positive value, negative value, or zero.

6. A quadrature demodulator claimed according to claim 2 or 3:

wherein the error detector determines the error between the phase angle of the output from the phase detector and the phase angle of the output of the second numerical control oscillator;

a differentiator for determining the error between the phase angle outputted from the error detector and the phase angle of the subsequent signal; and a sign discriminator for discriminating whether the output of the error detector is a positive value, negative value, or zero.

7. A method for demodulating quadrature modulation signal, comprising the steps of:

receiving a quadrature modulated signal;

generating a local carrier;

demodulating a quadrature modulation signal by complex-multiplying the quadrature modulated signal with the local carrier generated in the local oscillator;

detecting a symbol error between the carrier of the modulated signal and the local carrier from the signal demodulated at the complex-multiplier;

feeding back to control the local carrier generated at the local oscillator by feeding back the symbol error detected at the symbol error detector to the local oscillator;

generating a recovered phase signal under the control of the symbol error branched from the feedback loop; and compensating the local carrier to reduce the symbol error according to the recovered phase signal.

8. A method for demodulating quadrature modulation signal, comprising the steps of:

digitizing the incoming in-phase components;

digitizing the incoming quadrature component;

complex multiplying the digitized in-phase and quadrature components with a cosine wave component and a sine wave component to demodulate baseband in-phase and quadrature components;

detecting the phase angle from the constellation symbols of the demodulated in-phase and quadrature components in the phase detector;

detecting the error based upon the phase angle;

adjusting the gain of the error of the phase angle by a predetermined level;

smoothing out the gain of the error;

generating a local main-carrier at the first numerical control oscillator in accordance with the output of the smoothed signal;

converting the phase angle outputted from the first numerical control oscillator to the cosine wave component;

converting the phase angle outputted from the first numerical control oscillator to the sine wave component;

oscillating the frequency in the second numerical control oscillator based upon the output of the smoothed signal;

allowing or blocking the transmission of the smoothed signal to the first numerical control oscillator; and allowing or blocking the transmission of the oscillation signal of the second numerical control oscillator to the differentiator.

9. A method for demodulating quadrature modulation signal according to claim 8 wherein:

the error is generated by calculating the error between the phase angle of the output of the phase detector and the phase angle of the output of the second numerical control oscillator.

10. A method for demodulating quadrature modulation signal according to claim 8 or claim 9 further comprising:

obtaining a first error by calculating the error between the output phase angle of the second numerical control oscillator and the phase angle of the output of the phase detector the input of the first numerical control oscillator is maintained constant, so that its oscillation frequency is constant; and obtaining a second error determined solely upon the phase angle received from the phase detector, so that the phase angle of the output of the first numerical control oscillator is used for demodulating the in-phase and quadrature component in the complex multiplier;

then, adding the oscillation frequency of the second numerical control oscillator to the oscillation frequency of the first numerical control oscillator after the first numerically controlled oscillator receives the first error determined from the error between the output phase angles of the second control oscillator and the phase detector.

* * * * *